(12) United States Patent
Falvo et al.

(10) Patent No.: US 12,050,237 B2
(45) Date of Patent: Jul. 30, 2024

(54) CONTROL ROD DRIVE MECHANISM DIAGNOSTIC TOOL USING VOLTAGE AND CURRENT RECORDINGS

(71) Applicant: Westinghouse Electric Company LLC, Cranberry Township, PA (US)

(72) Inventors: Gregory E. Falvo, Suffield, CT (US); William S. Struzenski, Bloomfield, CT (US); Bruce A. P. Farver, Windsor Locks, CT (US); Vasilios Zaharis, Windsor, CT (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 309 days.

(21) Appl. No.: 17/434,324

(22) PCT Filed: Feb. 27, 2020

(86) PCT No.: PCT/US2020/020119
§ 371 (c)(1),
(2) Date: Aug. 26, 2021

(87) PCT Pub. No.: WO2020/205106
PCT Pub. Date: Oct. 8, 2020

(65) Prior Publication Data
US 2022/0172853 A1    Jun. 2, 2022

Related U.S. Application Data

(60) Provisional application No. 62/811,780, filed on Feb. 28, 2019.

(51) Int. Cl.
*G21C 17/00* (2006.01)
*G01R 19/00* (2006.01)
(Continued)

(52) U.S. Cl.
CPC ......... *G01R 19/0046* (2013.01); *G01R 31/72* (2020.01); *G21C 7/14* (2013.01); *G21C 17/00* (2013.01)

(58) Field of Classification Search
CPC .......... G21C 7/14; G21C 17/00; G01R 31/72; G01R 19/0046; Y02E 30/30
See application file for complete search history.

(56) References Cited

U.S. PATENT DOCUMENTS 5,999,583 A * 12/1999 Pysnik ...................... G21C 7/36
376/245
2011/0026660 A1* 2/2011 Meier ...................... G21C 7/36
376/237
(Continued)

FOREIGN PATENT DOCUMENTS

WO      2020205106 A2    10/2020

OTHER PUBLICATIONS

International Search Report and Written Opinion for International PCT Application No. PCT/US2020/020119, dated Oct. 19, 2020.

*Primary Examiner* — Eman A Alkafawi
*Assistant Examiner* — Suresh K Rajaputra
(74) *Attorney, Agent, or Firm* — K&L Gates LLP

(57) ABSTRACT

Disclosed is a diagnostic apparatus structured to be electrically connected with a coil stack of a drive mechanism of a control device of a nuclear reactor. The coil stack has a plurality of coils. The diagnostic apparatus includes a power supply and a controller including a processor and a memory that stores a number of routines including a number of instructions. When executed on the processor the instructions cause the diagnostic apparatus to apply to a coil a voltage that varies as a function of time, detect a current in the coil as a function of time, identify in the current a first inflection point and a second inflection point, and determine, based upon an electronic evaluation that includes the first (Continued)

inflection point and the second inflection point, that the coil is one of functioning properly and in a state of at least partial failure.

21 Claims, 10 Drawing Sheets

(51) Int. Cl.
*G01R 31/72* (2020.01)
*G21C 7/14* (2006.01)

(56) References Cited

U.S. PATENT DOCUMENTS

| 2013/0148772 | A1* | 6/2013 | Morton | G21C 17/12 |
| | | | | 376/258 |
| 2017/0025193 | A1* | 1/2017 | Caylor | G21C 7/12 |
| 2017/0160219 | A1* | 6/2017 | Shumaker | G21C 17/12 |

* cited by examiner

CONTROL ROD DRIVE MECHANISM DIAGNOSTIC TOOL USING VOLTAGE AND CURRENT RECORDINGS

CROSS-REFERENCE TO RELATED APPLICATIONS

This application is a U.S. National Stage Entry under 35 U.S.C. § 371 of International Patent Application No. PCT/US2020/020119, entitled CONTROL ROD DRIVE MECHANISM DIAGNOSTIC TOOL USING VOLTAGE AND CURRENT RECORDINGS, filed Feb. 27, 2020, which claims benefit under 35 U.S.C. § 119 to U.S. Provisional Patent Application No. 62/811,780, filed, Feb. 28, 2019, and titled CONTROL ROD DRIVE MECHANISM DIAGNOSTIC TOOL USING VOLTAGE AND CURRENT RECORDINGS, the entire disclosures of which are hereby incorporated by reference herein.

TECHNICAL FIELD

This disclosure relates generally to a diagnostic tool for Control Rod Drive Mechanisms (CRDM) and Control Element Drive Mechanisms (CEDM) that uses voltage and current recordings to determine problems with the CRDM and/or CEDM.

BACKGROUND

In a nuclear reactor for power generation, such as a pressurized water reactor, heat is generated by fission of a nuclear fuel such as enriched uranium, and transferred into a coolant flowing through a reactor core. The core contains elongated nuclear fuel rods mounted in proximity with one another on a fuel assembly structure through and over which the coolant flows. The fuel rods are spaced from one another in coextensive parallel arrays. Some of the neutrons and other atomic particles released during nuclear decay of fuel atoms in a given fuel rod pass through the spaces between fuel rods and impinge on the fissile material in an adjacent fuel rod, contributing to the nuclear reaction and to the heat generated by the core.

Movable control rods are dispersed throughout the nuclear core to enable control of the overall rate of fission, by absorbing a portion of the neutrons passing between fuel rods, which otherwise would contribute to the fission reaction. The control rods generally comprise elongated rods of neutron absorbing material and fit into longitudinal openings or guide thimbles in the fuel assemblies running parallel to and between the fuel rods. Inserting a control rod further into the core causes more neutrons to be absorbed without contributing to fission in an adjacent fuel rod; and retracting the control rod reduces the extent of neutron absorption and increases the rate of the nuclear reaction and the power output of the core.

The control rods are supported in cluster assemblies that are movable to advance or retract a group of control rods relative to the core. For this purpose, control rod drive mechanisms are provided, typically as part of the reactor vessel head located above the nuclear core. The reactor vessel is typically pressurized to a high internal pressure, and the control rod drive mechanisms are housed in pressure housings that are tubular extensions of the reactor pressure vessel.

One type of mechanism for positioning a control rod is a so-called magnetic jack, operable to move the control rod by an incremental distance into or out of the core in discrete steps. The control rod drive mechanism has three, four, or five electromagnetic coils ("coils" hereinafter) and armatures or plungers that are operated in a coordinated manner to raise and lower a drive rod shaft and a control rod cluster assembly coupled to the shaft. The coils are mounted around and outside the pressure housing. Two of the three coils operate grippers that when powered by the coils engage with the drive rod shaft.

The drive rod shaft has axially spaced circumferential grooves that are clasped by grip latches on the grippers, spaced circumferentially around the drive rod shaft. A third coil actuates a lift plunger coupled between the movable gripper and a fixed point. If control power to the control rod drive mechanism is lost, the two grippers both release and the control rods drop by gravity into their maximum nuclear flux damping position. So long as control power remains activated, at least one set of grippers hold the drive rod shaft at all times.

The coils are operated in a timed and coordinated manner alternately to hold and to move the drive shaft. The sequence of gripping actions and movements is different depending on whether the stepwise movement is a retraction or an advance. The grippers operate substantially alternately, although during the sequence of movements both grippers engage the drive shaft.

A number of particular coil mechanisms and gripper mechanisms are possible. Examples of coil jacking mechanisms with a stationary gripper, a movable gripper and a lifting coil as described are disclosed, for example, in U.S. Pat. No. 5,307,384 to King et al., U.S. Pat. No. 5,066,451 to Tessaro and U.S. Pat. No. 5,009,834 to Tessaro, all of which are hereby incorporated by reference.

SUMMARY

In one aspect, the present disclosure provides a diagnostic apparatus structured to be electrically connected with a coil stack of a drive mechanism of a control device of a nuclear reactor. The coil stack having a plurality of coils. The diagnostic apparatus comprising a power supply and a controller comprising a processor and a memory. The memory having stored therein a number of routines comprising a number of instructions which, when executed on the processor, cause the diagnostic apparatus to: apply to a coil of the plurality of coils a voltage that varies as a function of time; detect a current in the coil as a function of time; identify in the current a first inflection point and a second inflection point; and determine, based upon an electronic evaluation that comprises the first inflection point and the second inflection point, that the coil is one of: functioning properly; and in a state of at least partial failure.

In another aspect, the present disclosure provides a diagnostic method for diagnosing a drive mechanism of a control device of a nuclear reactor using a diagnostic apparatus structured to be electrically connected with a coil stack. The coil stack having a plurality of coils. The diagnostic apparatus comprising: a power supply and a controller comprising a processor and a memory, the memory having stored therein a number of routines comprising a number of instructions which, when executed on the processor, cause the diagnostic apparatus to execute the diagnostic method. The method comprising: applying to a coil of the plurality of coils a voltage that varies as a function of time; detecting a current in the coil as a function of time; identifying in the current a first inflection point and a second inflection point; and determining, based upon an electronic evaluation that comprises at least one of the first inflection point and the second inflection point, that the coil is one of: functioning properly; and in a state of at least partial failure.

In another aspect, the present disclosure provides a diagnostic method for diagnosing a drive mechanism of a control device of a nuclear reactor using a diagnostic apparatus structured to be electrically connected with a coil stack. The coil stack comprising at least three coils. The diagnostic apparatus comprising: a power supply; and a controller comprising a processor and a memory, the memory having stored therein a number of routines comprising a number of instructions which, when executed on the processor, cause the diagnostic apparatus to execute the diagnostic method. The method comprising: applying a programmed voltage to each of the at least three coils over a predetermined period, one at a time, wherein while one of the at least three coils is powered, the other coils are unpowered; monitoring a current within each of the at least three coils over the predetermined period; and determining, based on the monitored current, whether a component of the drive mechanism of the control device of the nuclear reactor is one of: functioning properly; and in a state of at least partial failure.

BRIEF DESCRIPTION OF DRAWINGS

The following drawings are illustrative of particular aspects of the present disclosure and therefore do not limit the scope of the appended claims. The drawings are intended for use in conjunction with the explanations in the following description. The disclosed aspects will hereinafter be described in conjunction with the appended drawings, wherein like numerals denote like elements.

DETAILED DESCRIPTION

The following detailed description is exemplary in nature and provides some practical illustrations and examples. Those skilled in the art will recognize that many of the noted examples have a variety of suitable alternatives. A number of various exemplary diagnostic tools for CRDM and/or CEDM mechanisms for nuclear reactors are disclosed herein using the description provided as follows in addition to the accompanying drawings. Each of the aspects disclosed herein can be employed independently or in combination with one or more (e.g., all) of the other aspects disclosed herein.

Figure 1:
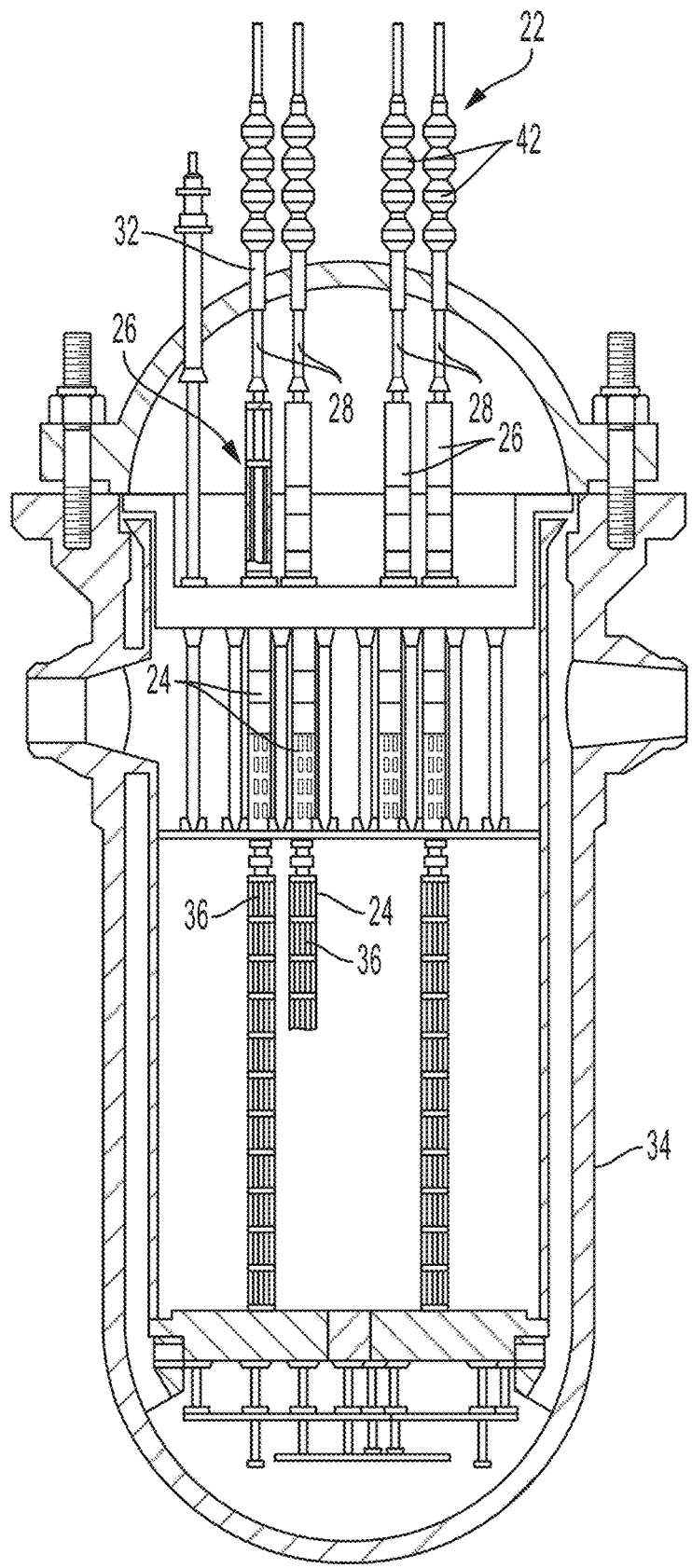
FIG. 1 is an elevation view, partly in section, showing a nuclear reactor core.

FIG. 1 is an elevation view, partly in section, showing a nuclear reactor core. In one aspect, the present disclosure provides a method for analyzing the operation of an electromagnetic drive mechanism 22 for nuclear control rods 24, shown generally in FIG. 1, utilizing a diagnostic tool in a manner that permits detection of performance problems including not only failure of components, but also deterioration of performance over time. By collecting and storing data on the performance of the components and comparing present performance to previously stored historical data, the diagnostic tool permits detection of impending problems before a failure actually occurs. In one aspect, a diagnostic tool for CRDM and/or CEDM mechanisms for nuclear reactors may comprise a diagnostic system 100 (see FIG. 4) may be employed prior to deploying the electromagnetic drive mechanism 22 for control rods 24 in a reactor core pressure vessel 34. In one aspect, the diagnostic system 100 may be employed to diagnose CRDM and/or CEDM mechanisms while the reactor vessel head is in the head stand while the nuclear power plant is in outage. In other aspects, the diagnostic system 100 is intended for use while the nuclear power plant is in outage, with the reactor vessel head installed on the reactor vessel. It may be used on mechanisms during any phase of their life, fabrication, operation, or post failure diagnostics. In one aspect, the diagnostic system 100 may be portable.

The control rods 24 as shown in FIG. 1 are attached in clusters 26, each cluster being commonly driven by a drive rod 28 disposed in a vertical extension housing 32 of the reactor core pressure vessel 34 containing the fuel rod assemblies 36 into which the control rods 24 are advanced or from which the control rods 24 are retracted for variable damping of nuclear flux. The moving parts of the mechanism are within the pressure envelope of the reactor and the electromagnetic coils 42 for driving the movable parts are disposed around and about each of the extensions.

Figure 2:
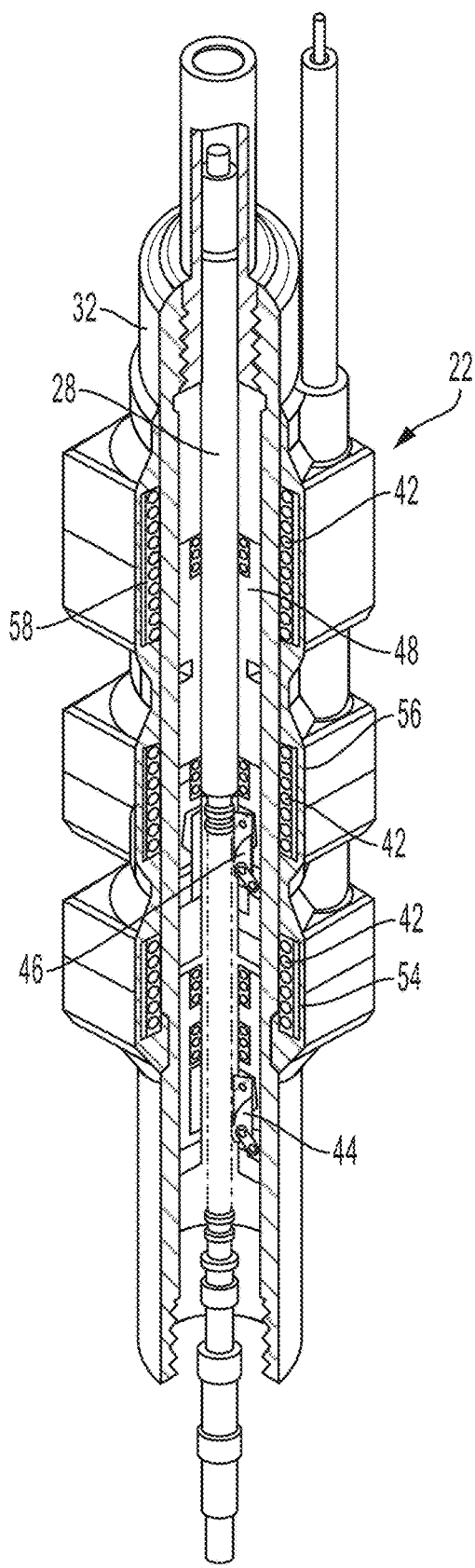
FIG. 2 is a perspective view, partly cut away, showing the stationary and movable grippers and lifting mechanism of a control rod drive mechanism of a three coil type CRDM.
Figure 3:
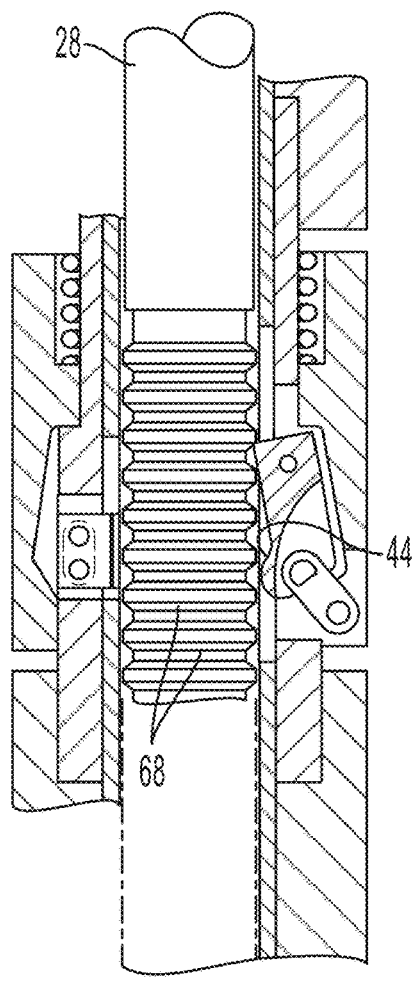
FIG. 3 is a more detailed sectional view showing exemplary stationary and movable grippers.

FIG. 2 shows one drive rod mechanism with the extension housing partly cut away, and FIG. 3 is a detailed view, partly in section, showing exemplary grippers that or operable in sequences to engage, lift and/or lower the drive rod when the associated coils of the drive mechanism are energized. This arrangement is substantially as disclosed in U.S. Pat. No. 5,009,834 to Tessaro, which is hereby incorporated by reference with respect to the mechanical and electromagnetic aspects of the control rod drive.

The drive mechanism comprises stationary grippers 44 and movable grippers 46 for engaging the drive rod 28, and a lifting armature 48 by which the movable grippers are lifted or allowed to fall along the longitudinal axis of the drive rod 28. Each is operated by a corresponding electromagnetic coil 54, 56, 58. The grippers are arranged normally to release the drive rod 28, for example being mounted to pivot clear of the drive rod or spring biased to retract, when not electromagnetically forced to engage. Thus, when neither of the stationary and movable gripper coils 54, 56 is energized, the corresponding grippers 44, 46 release their hold on the drive rod, which falls by gravity, allowing the control rods 24 to drop into the nuclear core. At other times the coils are energized for either holding drive rod 28 and the associated control rods 24 in position or for stepping them up or down in response to signals from a controller (not shown) that regulates the output level of the reactor. FIG. 3 shows an exemplary mounting of a movable gripper, in particular one of three grippers that are spaced circumferentially around drive rod 28 for bearing radially inwardly to engage ridges or grooves 68 on rod 28 or outward to clear the ridges or grooves. The same reference numbers are used throughout the drawings to identify corresponding elements.

Figure 4:
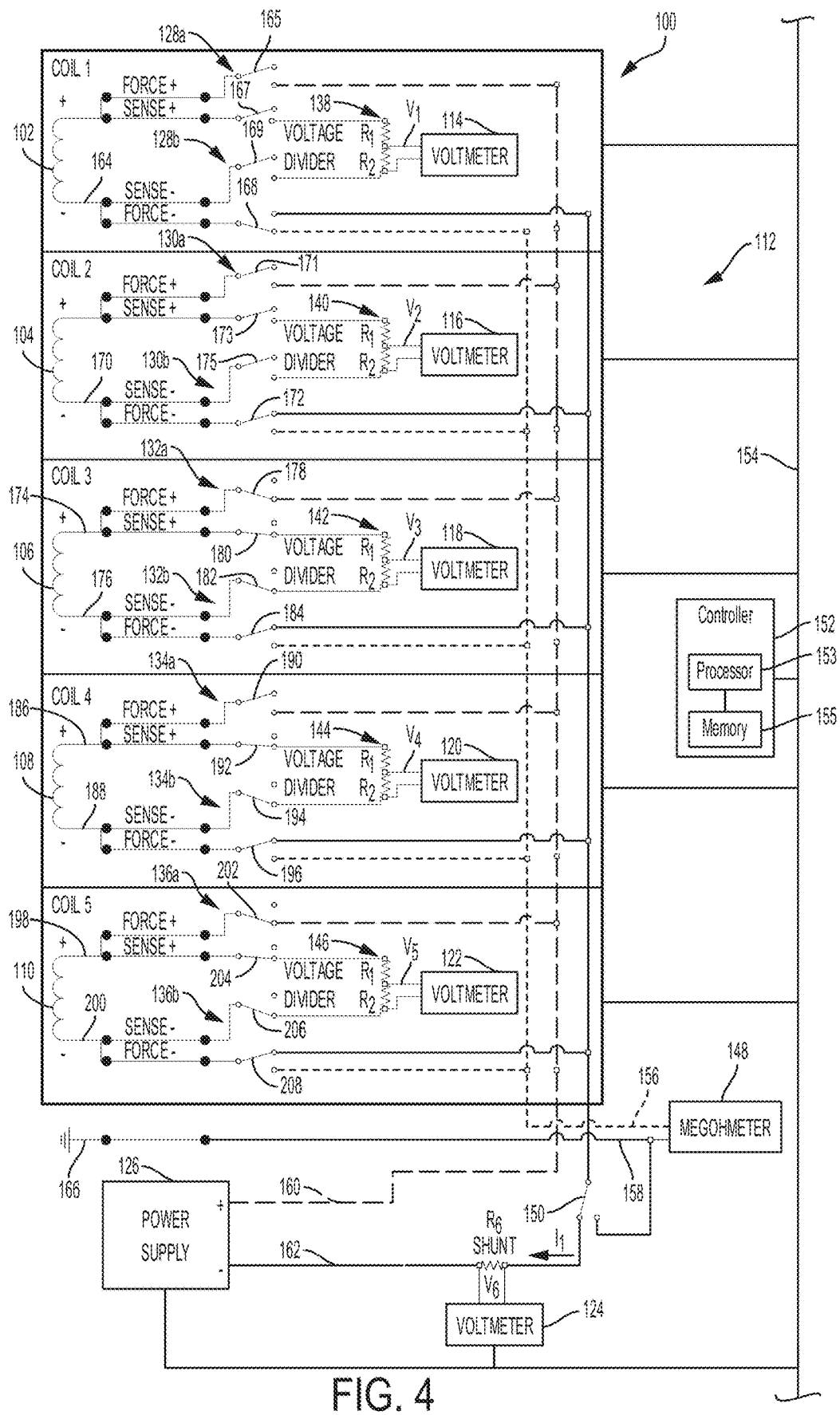
FIG. 4 illustrates a hardware layout of a diagnostic tool for CRDM and/or CEDM mechanisms of nuclear reactors, according to at least one aspect of the present disclosure.

FIG. 4 illustrates a hardware layout of a diagnostic system 100 for CRDM and/or CEDM mechanisms of nuclear reactors, according to at least one aspect of the present disclosure. For conciseness and clarity of disclosure, hereinafter "CRDM and/or CEDM mechanisms" will be are referred to hereinafter as "control rod drive mechanism." Generally, the diagnostic system 100 may be configured to power each coil 54, 56, 58, as shown in FIG. 2 and represented schematically as 102, 104, 106, 108, 110 in FIG. 4, of the mechanism, one coil at a time, while recording the voltage being applied to the coil, the current flowing through the coil, and the induced voltage in the unpowered coils. The diagnostic system 100 will use this data to determine certain characteristics of the mechanism and to determine if degradation is present. The diagnostic system 100 will also perform a 500 volt, 60 second megohm insulation resistance test between each of the coils, and each coil to ground. One example implementation of the diagnostic system 100 is descried hereinbelow.

The diagnostic system 100 defines a coil stack 112 of five coil circuits labeled Coil-1 to Coil-5. The coil stack 112 may include at least three coil circuits Coil-1, Coil-2, and Coil-3, however, as shown in FIG. 2, the diagnostic system 100 may be adapted and configured to operate with an additional fourth coil circuit Coil-4 and/or an additional fifth coil circuit Coil-5. It will be appreciated that the coil stack 112 may comprise additional coil circuits $C_n$, where n is an integer greater than five. Each of the coil circuits Coil-1 to Coil-5 comprises a corresponding coil 102, 104, 106, 108, 110 attached through a four-wire configuration to a sensing circuit through two double pole double throw (DPDT) relays 128a, 128b, 130a, 130b, 132a, 132b, 134a, 134b, 136a, 136b. Each of the sensing circuits comprises a voltage divider network 138, 140, 142, 144, 146, or other gain adjusting device, coupled to a sensing voltmeter 114, 116, 118, 120, 122. The diagnostic system 100 further comprises a power supply 126 to apply voltage to the coils 102-110, a shunt resistor $R_6$ and a shunt sensing voltmeter 124 to measure current $I_1$, a megohmeter 148, and a single pole double throw (SPDT) relay 150 to switch current from the coils 102-110 to either the shunt resistor $R_6$ or the megohmeter 148. It will be appreciated that various configurations of the diagnostic system 100 may be employed to power the coils 102-110 and senses various electrical parameters of the coils 102-110 to diagnose the state of the coils 102-110. It will appreciated that although the relays 128a, 128b, 130a, 130b, 132a, 132b, 134a, 134b, 136a, 136b, 150 are depicted schematically as mechanical relays with mechanical contacts, in alternative aspects, the relays 128a, 128b, 130a, 130b, 132a, 132b, 134a, 134b, 136a, 136b, 150 may be implemented with solid state relays (SSR) and other alternatives such as various types of field effect transistors (FET). SSRs and FETs should be selected to meet suitable path resistance, isolation between contacts, operating current, and operating voltage requirements for the application. Other suitable alternatives are contemplated without limitation.

The diagnostic system 100 further comprises an embedded controller 152 coupled to the coil circuits Coil-1 to Coil-5, coils 102-110, relays 128a,b-136a,b, power supply 126, shunt voltmeter 124, and megohmeter 148 interconnected over an electrical bus 154. The embedded controller 152 may comprise a processor 153, a microcontroller, or microprocessor with a memory 155 configured to process machine executable instructions, a logic circuit, field programmable gate array circuit (FPGA), programmable logic device (PLD), or combinations of the foregoing control circuits, as defined more broadly herein. The embedded controller 152, processor 153, and memory 155 may be configured to switch the power supply 126 into the coil circuits Coil-1 to Coil-5 by switching the relays 128a,b-136a,b in and out of the circuit to measure current $I_1$ (voltage $V_6$) and sensing voltages $V_1$-$V_5$, and to control the relay 150 to measure either current $I_1$ or megger each coil 102-110 coil-to-coil and coil-ground, measure the resistance of each coil 102-110, couple a passive coil 102-110, or couple an active coil 102-110.

Power supply voltage and current monitor signals may be monitored by data acquisition channels coupled to the coil circuits Coil-1 to Coil-5. These measurements are compared to the voltage at the voltage divider networks 138-146, current $I_1$ measured by the shunt resistor $R_6$ and shunt sensing voltmeter 124, and provide an error if the two measurements differ significantly from the voltage at the voltage divider networks 138-146 and shunt measurements. Power supply voltage monitored at the coil stack 112 by the sensing voltmeters 114-122 data acquisition channels through a 10:1 voltage divider networks 138-146 are considered the primary voltage measurement for calculations and traces. Current $I_1$ returning to the power supply 126 is monitored using the voltage drop $V_6$ across a shunt resistor $R_6$ and is considered the primary current measurement for calculations and traces.

The diagnostic system 100 is configured to generate a programmed voltage to sequentially power the coils 102-110 of the coil stack 112 while recording and analyzing the resultant current $I_1$ that flows through each coil 102-110 and the voltages $V_1$-$V_5$ applied to each coil 102-110 that is being powered by the power supply 126 and the voltages $V_1$-$V_5$ in the coils 102-100 that are unpowered. The voltages $V_1$-$V_5$ are measured by the corresponding sensing voltmeters 114-122 and the resultant current $I_1$ is measured by the shunt voltage $V_6$ across shunt resistor $R_6$ as measured by the shunt voltmeter 124. Each of the coils 102-110 may be connected to the power supply 126, the sensing voltmeters 114-122, the shunt sensing voltmeter 124, and the megohmeter 138 by a pair of double pole double throw (DPDT) relays 128a,b-136a,b. The process is controlled by the controller 152 and the measurements are recorded by the processor 153 and stored in the memory 155. The stored measurements are analyzed by one or more control algorithms executed by the processor 153 to determine certain characteristics of the mechanism and to determine if degradation is present.

In the example illustrated in FIG. 4, the five coil circuits Coil-1 to Coil-5 are shown in different relay configurations to implement different test configurations. It will be appreciated, however, that any one of the coil circuits Coil-1 to Coil-5 may be configured in any one of the configurations illustrated in FIG. 4. Although generally, the coil circuits Coil-1 to Coil-5 are configured and tested by the controlled 152 one at a time, the diagnostic system 100 may be configured to configure and test two or more coil circuits Coil-1 to Coil-5 simultaneously. Once configured, the coils 102-110 may be tested individually one-at-a-time or simultaneously.

In the example illustrated in FIG. 4, coil circuit Coil-1 in the coil stack 112 is configured to measure the electrical resistance of the insulation of the coil 102 relative to ground 166 referred to as coil-ground insulation resistance. This test is generally known as a megger test. A first terminal 156 of the megohmeter 148 is connected to the force negative (−) terminal 164 of the coil 102 through a contact 168 of the DPDT relay 128b and a second terminal 158 of the megohmeter 148 is connected to ground 166 while the positive (+) terminal of the coil 102 is disconnected from the circuit. Coil-to-coil insulation resistance may be measured by connecting the first terminal 156 of the megohmeter 148 to the first terminal 164 of the coil 102 to a terminal of another coil in the coil stack 112. The force positive (+) contact 165 and the sense positive (+) contact 167 of the DPDT relay 128a and the sense negative (−) contact 169 of the DPDT relay 128b are open. The electrical resistance of the insulation of the coil 102 relative to ground 166 measurement $V_1$ is recorded by the processor 153 and stored in the memory 155. The stored measurement $V_1$ is analyzed by a control algorithm executed by the processor 153 to determine certain characteristics of the mechanism and to determine if degradation is present. It will be appreciated that any of the other coil circuits Coil-2, Coil-3, Coil-4, and Coil-5 may be configured similarly to coil circuit Coil-1.

In the example illustrated in FIG. 4, the coil circuit Coil-2 in the coil stack 112 is configured to measure the coil-to-coil and coil-to-ground electrical resistance of the insulation of other coils in the coil stack 112. As shown in coil circuit Coil-2, the negative (−) terminal 170 of the coil 104 is coupled to the negative (−) terminal 162 of the power supply through force negative (−) contact 172 of the DPDT relay 130b. The force positive (+) contact 171 and the sense positive (+) contact 173 of the DPDT relay 130a and the sense negative (−) contact 175 of the DPDT relay 130b are open. The coil-to-coil and coil-to-ground electrical resistance of the insulation of other coils measurements $V_2$ are recorded by the processor 153 and stored in the memory 155. The stored measurement $V_2$ is analyzed by a control algorithm executed by the processor 153 to determine certain characteristics of the control rod drive mechanism and to determine if degradation is present. It will be appreciated that any of the other coil circuits Coil-1, Coil-3, Coil-4, and Coil-5 may be configured similarly to coil circuit Coil-2.

In the example illustrated in FIG. 4, the coil circuit Coil-3 is configured to measure the electrical resistance of the coil 106. In this configuration, the positive (+) terminal 174 of the coil 106 is coupled to the positive (+) terminal 160 of the power supply 126 through a force positive (+) contact 178 of the DPDT relay 132a and the negative (−) terminal 176 of the coil 106 is connected to the negative (−) terminal 162 of the power supply 126 through a force negative (−) contact 184 of the DPDT relay 132b. In this configuration, the power supply 126 supplies a current $I_1$ through the coil 106. The electrical resistance of the coil 106 is manifested as a voltage drop across the positive (+) terminal 174 and the negative (−) terminal 176 of the coil 106. The voltage across the coil 106 is coupled to the voltmeter 118 through an optional voltage divider network 142 or amplifier to adjust the voltage to the correct appropriate level for the voltmeter 118. The sense positive (+) contact 180 of the DPDT relay 132a is connected to the top of series resistor $R_1$ of the voltage divider network 142 and the sense negative (−) contact 182 of the DPDT relay 132b is connected to the bottom of series resistor $R_2$. The voltmeter 118 measures the sensed voltage $V_3$ from the central node to the bottom of resistor R2 of the voltage divider network 142. The sensed voltage $V_3$ is proportional to the electrical resistance of the coil 106. The current $I_1$ through the coil 106 is measured by the voltmeter 104 as voltage V6 across the shunt resistor $R_6$. The electrical resistance of the coil 106 measured as output voltage $V_3$. The resulting current $I_1$ through the coil 106 is measured as shunt voltage $V_6$. Both $V_3$ and $V_6$ are recorded by the processor 153 and stored in the memory 155. The stored measurement $V_2$ is analyzed by a control algorithm executed by the processor 153 to determine certain characteristics of the control rod drive mechanism and to determine if degradation is present. It will be appreciated that any of the other coil circuits Coil-1, Coil-2, Coil-4, and Coil-5 may be configured similarly to coil circuit Coil-3.

In the example illustrated in FIG. 4, the coil circuit Coil-4 is configured to measure induced voltage in an unpowered coil 108. In this configuration, the positive (+) terminal 160 of the power supply 126 is disconnected from the positive (+) terminal 186 of the coil 108 by disconnecting the force positive (+) contact 190 of the DPDT relay 134a. The negative (−) terminal 162 of the power supply 126 is connected to the negative (−) terminal 188 of the coil 108 through the force negative (−) contact 196 of the DPDT relay 136b. The voltage induced across the coil 108 is coupled to the voltmeter 120 through the voltage divider network 144. The sense positive (+) contact 192 of the DPDT relay 134a is connected to the top of series resistor $R_1$ of the voltage divider network 142 and the sense negative (−) contact 194 of the DPDT relay 134b is connected to the bottom of series resistor $R_2$. The voltmeter 120 measures the induced voltage $V_4$ between the central node and the bottom of resistor $R_2$ of the voltage divider network 144. Thus, as the unpowered coil 108 develops an induced current $I_1$ coupled from electromagnetic fields produced by nearby coils in the coil stack 112, the resulting induced voltage $V_4$ is coupled to and is measured by the voltmeter 120. The resulting current $I_1$ through the coil 108 is measured as shunt voltage $V_6$. Both $V_4$ and $V_6$ are recorded by the processor 153 and stored in the memory 155. The stored measurement $V_2$ is analyzed by a control algorithm executed by the processor 153 to determine certain characteristics of the control rod drive mechanism and to determine if degradation is present. It will be appreciated that any of the other coil circuits Coil-1, Coil-2, Coil-3, and Coil-5 may be configured similarly to coil circuit Coil-4.

In the example illustrated in FIG. 4, the coil circuit Coil-5 is configured to drive the coil 110 and record the voltage being applied to coil 110 and the current through the coil 110. In this configuration, the positive (+) terminal 160 of the power supply 126 is connected to the positive (+) terminal 198 of the coil 110 through the force positive (+) contact 202 of the DPDT relay 136a. The negative (−) terminal 162 of the power supply 126 is connected to the negative (−) terminal 200 of the coil 110 through the force negative (−) contact 208 of the DPDT relay 136b. The voltage applied across the coil 110 is coupled to the voltmeter 122 through the voltage divider network 146. The sense positive (+) contact 204 of the DPDT relay 136a is connected to the top of series resistor $R_1$ of the voltage divider network 146 and the sense negative (−) contact 206 of the DPDT relay 136b is connected to the bottom of series resistor $R_2$. The voltmeter 122 measures the applied voltage $V_5$ between the central node and the bottom of resistor $R_2$ of the voltage divider network 146. Thus, as voltage is applied to the coil 110, the resulting applied voltage $V_5$ is coupled to and is measured by the voltmeter 122. Both $V_5$ and $V_6$ are recorded by the processor 153 and stored in the memory 155. The stored measurement $V_2$ is analyzed by a control algorithm executed by the processor 153 to determine certain characteristics of the control rod drive mechanism and to determine if degradation is present. It will be appreciated that any of the other coil circuits Coil-1, Coil-2, Coil-3, and Coil-4 may be configured similarly to coil circuit Coil-5.

The diagnostic system 100 is intended to be used while the reactor vessel head with the control rod drive mechanisms is either in the head stand or on the reactor vessel. In one aspect, the diagnostic system 100 is intended for use while the nuclear power plant is in outage, however, in various other aspects, the diagnostic system 100 may be used on mechanisms during any phase of their life, fabrication, operation, or post failure diagnostics. The features of the diagnostic system 100 are to use a diagnostic programmed voltage source from the power supply 126 to actuate the control rod drive mechanism, while monitoring the voltage $V_1$-$V_5$ and current $I_1$ (e.g., shunt voltage $V_6$) to analyze the coil stack 112 and latch assembly that are the components of the control rod drive mechanism. This diagnostic system 100 can incorporate a borescope system to inspect the latch arms while actuating the control rod drive mechanism. The borescope system is not required for the diagnostic system 100, however, utilizing the diagnostic system 100 while actuating the control rod drive mechanism farther aides in the diagnosis of the control rod drive mechanism.

From the voltage applied by the power supply 126 and the recorded current $I_1$, the diagnostic system 100 may be configured to calculate the following parameters associated with a coil 102-110 under test: coil resistance, coil temperature, coil temperature rise under load, electromagnetically induced voltage in the unpowered coils, while powering another coil, and electromagnetic force required to close (actuate) the individual subassemblies within the control rod drive mechanism.

In various aspects, the diagnostic system 100 may be configured to identify the following problems within the control rod drive mechanism based on the analysis of the parameters associated with the coil 102-110 under test: failed or degraded coils, incorrect coil polarity (wiring), broken springs within the control rod drive mechanism latch assembly, increased friction due to corrosion products or failed components.

This diagnostic system 100, however, does not rely on accelerometers or any additional sensors which would need to be placed on the control rod drive mechanism. Thus, advantageously, all diagnostic tests can be performed from the application of the programmed voltage and monitoring the resulting generated current and voltages. Utilizing the current traces generated by the programmed voltages provides the diagnostic system 100 with a more detailed view into the current decay of the coils 102-110, the health of the coils 102-110, and the friction within the control rod drive mechanism than can be achieved today only with an accelerometer based system.

The control rod drive latch assemblies contain springs and sliding components. It is difficult to assess between coil 102-110 problems and latch assembly problems. Within the latch assembly it is also very difficult to predict the amount of friction force and spring force from the present methods of recording current profile traces. The three-coil CRDM and four-coil and five-coil CEDM systems, referred to herein as "control rod drive mechanism" use a system of electrical currents through the coils 102-110 to actuate a mechanical latch assembly, which moves the control rod drive line.

In one aspect, the diagnostic system 100 is configured to provide a programmed voltage control of each coil 102-110, one at a time, while monitoring the voltage $V_1$-$V_5$ and current $I_1$ within the coils 102-110. From the voltage $V_1$-$V_5$ and current $I_1$ profiles, and the known number of turns for the coil 102-110, the resultant magnetic force can be monitored during the diagnostic test. The CRDM latch assembly actuations (opening and closing) will be observable in the recorded current. By recording the current and voltage at which the latch assembly actuations occur, the force to overcome the internal friction and springs can be determined, to determine the health of the CRDM and/or CEDM control rod assembly. The diagnostic system 100 will also use the current and voltage relationship to monitor the resistance of the coil 102-110 during the test period. From the change in the resistance of the coil 102-110 during the period of the test, the coil insulation system also can be monitored. The diagnostic system 100 can be used to monitor the induced voltage in the coils 102-110 which are not powered during a specific point within the test to determine the polarity of the unpowered coils and the relative strength of the induced voltage within the unpowered coils to determine the condition of the coil system. The diagnostic system 100 is intended to be used, and will be most accurate, when the reactor vessel head containing the control rod drive mechanisms is in the head stand and the drive rod and associated control assembly will not be moved by the latch assembly. The same approach may be used with the reactor head installed on the reactor vessel, with slightly reduced accuracy.

In various aspects, the diagnostic system 100 controller 152 controls the power supply 126 to apply a voltage controlled profile as an input to each coil 102-110 in the coil stack 112 one at a time. The diagnostic system 100 then records the current and voltage to determine the force required to close pole faces and the resistance of the coil 102-110 during the test. The diagnostic system 100 also records the change in temperature within the coil 102-110 under test, which indicates the condition of the coil insulation system since temperature is a direct function of the resistance of the coil 102-110. The diagnostic system 100 also records induced voltage on unpowered coils to assess the health of the coil 102-110.

The diagnostic system 100 may be employed with the reactor vessel in the head stand to isolate the control rod drive mechanism from the drive line to increase accuracy. The diagnostic system 100 is fully automated to automatically perform a test of the coil stack to improve repeatability and accuracy.

The diagnostic system 100 is a test unit that does not rely on plant installed rod control equipment. As the control rod drive mechanism is an electro-mechanical system, isolating the control rod drive mechanism from the plant rod control system further increases the accuracy of the diagnostic system 100 to limit observed characteristics to be from within the control rod drive mechanism coil stack 112 or latch assembly only.

The diagnostic system 100 provides advantages in the field of control rod drive mechanism diagnostics. The diagnostic system 100 generally determines the continued viability and workability of the coil stack 112 that operates a drive mechanism of a control rod apparatus. The diagnostic system 100 provides purely an electrical evaluation, specifically of the current $I_1$ and voltage $V_1$-$V_5$ in the various coils 102-110 of the coil stack 112 rather than employing accelerometers applied to moving parts, with the coils 102-110 thereafter being energized and the signals from the accelerometers being evaluated in order to determine the functionality of the coil stack 112.

There are three different types of coil stacks 112, one having three coils (as shown in FIGS. 1-3), one having four coils, and one having five coils. A three coil stack 112 comprises a lift coil, moving gripper coil, and stationary gripper coil. A four coil stack 112 comprises an upper lift coil, an upper gripper coil, a lower lift coil, and lower gripper coil. A five coil stack 112 comprises a lift coil, an upper gripper coil, a pull down coil, a load transfer coil, and a lower gripper coil. Additional coils may be added to the coil stack 112 without limiting the scope of the present disclosure and appended claims.

In one aspect, the diagnostic system 100 in accordance with the present disclosure provides a power supply 126 that includes a DC power source, a controller 152 comprising a processor 153 apparatus and a memory 155, and a single connector to connect the coil stack 112 to the controller 152. The connector is usable to connect the diagnostic system 100 to the coil stack 112 once the DC electrical power that operates the coil stack 112 is disconnected from the coils 102-110. The processor 153 apparatus of the controller 152 includes a control apparatus to cause the power supply 126 to generate a linear ramp voltage such that the voltage increases in a linear fashion, specifically a straight ramp. The voltage is checked at the input to the coil connector itself rather than at the power supply 126 in order to avoid measuring losses between the power supply 126 and the coil connector. In another aspect, the power supply 126 may be controlled to generate a linear ramp such that the voltage decreases in a linear fashion.

In addition to monitoring the voltage $V_1$-$V_5$ at the connector of the coil 102-110 that is being powered, the current $I_1$ that is flowing through the powered coil 102-110 is also measured. Additionally, the voltage induced in each of the other coils 102-110 of the coil stack 112 is also measured as a function of time.

As the voltage that is applied by the power supply 126 to the energized coil 120-110 varies (e.g., increases or decreases) as a function of time, the current $I_1$ that is flowing through the energized coil likewise varies (e.g., increases or decreases) as a function of time, until the electromagnetic force of the coil 102-110 imparts to the plunger sufficient electromagnetic force to overcome the spring bias and the friction in the system and to cause the plunger to begin to move. Up until the point at which the stationary plunger begins to move, the increasing voltage and current causes the coil to become charged. The current will be increasing to this point. Once the plunger begins to move, however, the current will drop, thus creating an inflection point in the current trace at the point where movement is initiated (e.g., see FIGS. 6-8). As the voltage continues to increase, the plunger will move, and the current will drop until the plunger reaches a mechanical stop, at which point the current will no longer drop, and rather will increase, thus creating a second inflection point in the current curve.

If the plunger begins to move too quickly, i.e., at too low of a current, this indicates a broken or otherwise failed spring. If the plunger moves too late, i.e., at too high of a current, this indicates either a failing coil 102-110 or additional friction due to corrosion or the like. Alternatively, if the time required between the two inflection points is too great, this can likewise indicate the existence of a failing coil 102-110 and/or excessive friction. In either such event, the voltage on the adjacent (i.e., unpowered) coils 102-110 that is induced by the powered coil is measured. If the voltage is as expected, this would indicate that the problem is due to friction. On the other hand, the voltage in the unpowered coils is less than what is expected, this would indicate a failing coil 102-110 that is being powered.

Further regarding the evaluation of the induced voltages, i.e., the voltages that are induced in the unpowered coils, a voltage having the polarity that was expected confirms the correct polarity of the wiring of such coils. Detecting a voltage of a magnitude that is different than what was expected, typically lower than that which was expected, indicates that the powered coil has either failed or is in the process of failing. In one scenario, a coil 102-110 can fail by having its winding shorted to ground, meaning that only a subset of the wire turns of the coil have current passing therethrough. This is why a megohmeter 148 test to apply a high voltage between the coil and its metal case to determine whether current is leaking to ground is done prior to the other tests performed by the detection apparatus. Another mode of failure of a coil 102-110 is a turn-to-turn short wherein two adjacent turns of the coil windings are shorted together. In one such type of short, a single turn may be shorted to an adjacent turn, meaning that instead of the coil actually having 300 turns, the result effectively is 299 turns. Another such type of short is a layer-to-layer short wherein a substantial number of the turns are bypassed, so that instead of having 300 turns, the result is perhaps 200 turns or 199 turns, or the like. In any event, a reduced voltage that is detected as being induced in an unpowered coil indicates that the powered coil has failed or is failing.

The data signals that are obtained from the powered coil can provide a further insight into the integrity of the insulation that is used around the coil. Electrical insulation has some similarities to thermal insulation, and a failure of the insulation will be apparent from the thermal characteristics of the coil that is being energized. If a fixed voltage is applied to a coil, the applying of a current at that fixed voltage will cause the coil to heat up. Since resistance of a conductor varies with temperature in a known fashion (such as with copper), an increase in the temperature of the coil will result in a known change in resistance, which will thus alter the current that is flowing through the coil. For instance, if voltage is divided by current, this results in a value of resistance, which has a fixed relationship with temperature (in the case of copper), and thus the temperature of the coil over time can be derived from the resistance over time. A coil whose insulation is failing will heat up more rapidly than if the insulation is intact.

Specific examples of measurements of resistance, induced voltage, stationary powered coil voltage, stationary coil current, stationary gripper voltage, and stationary gripper coil temperature rise that can be made by the diagnostic system 100 are described hereinbelow in connection with FIGS. 5-9.

Figure 5:
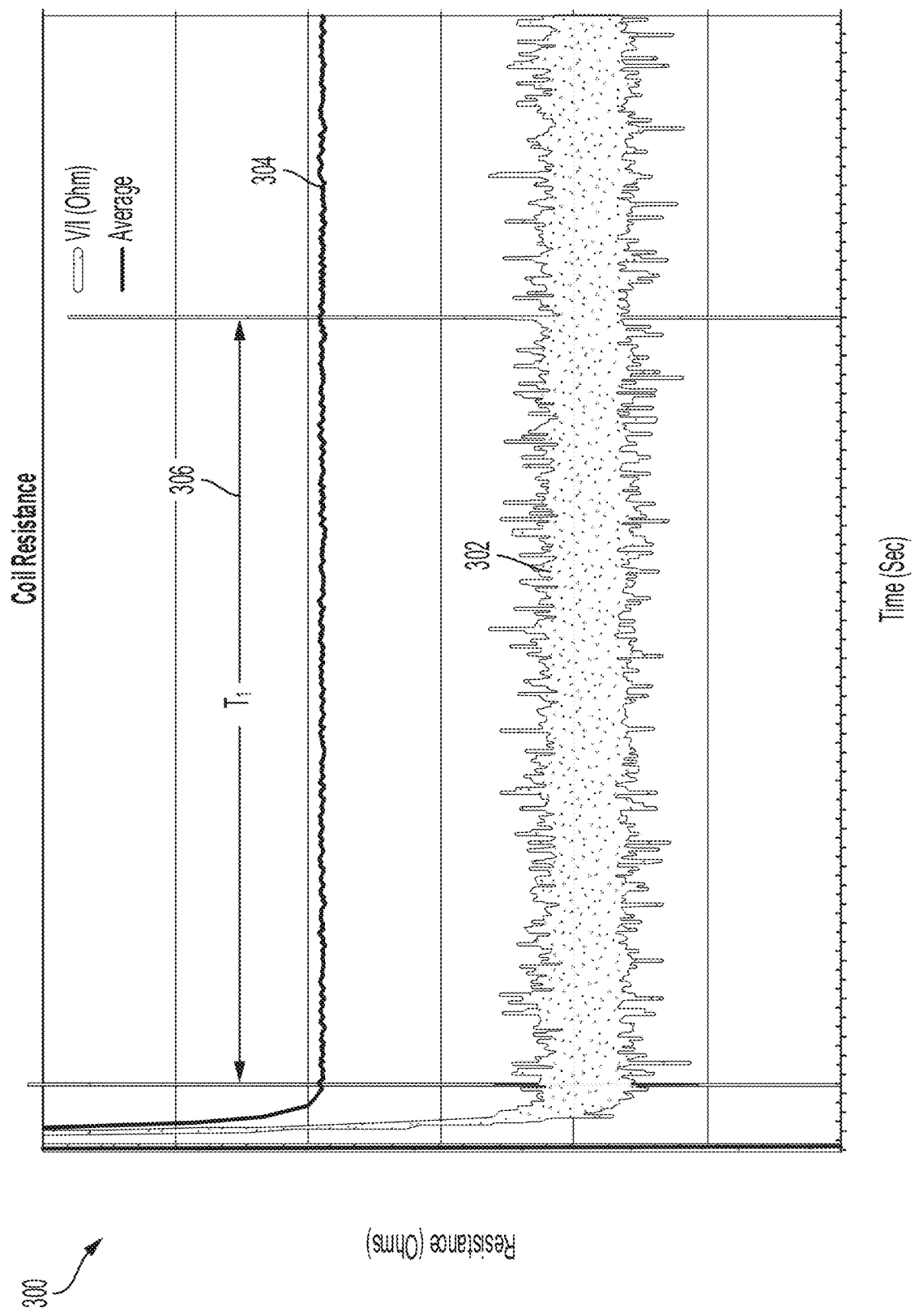
FIG. 5 is a graph of resistance measurements made and recorded by the diagnostic system, according to at least one aspect of the present disclosure.

FIG. 5 is a graph 300 of resistance measurements made and recorded by the diagnostic system 100, according to at least one aspect of the present disclosure. A first curve 302 is represents resistance in Ohms based on voltage and current (V/I) measurements and a second curve 304 represents a average over a fixed period of time 306 (T1). The horizontal axis represents time (Sec). The left vertical axis represents the resistance (Ohms) scale of the first curve 302 and the right vertical axis represents the resistance (Ohms) scale of the second curve 304. This graph 300 is an example of how the baseline coil resistance and final coil resistance (and temperature) can be calculated.

Standard digital multimeters use a controlled current and measure voltage. Digital multimeters use a considerably smaller current than can be controlled by the power supply, which can typically source around 1 milliamp. The diagnostic system 100 power supply 126 can source a current of 1 Amp or less and measure the resulting voltage.

Coil temperature can be calculated from coil resistance by the method presented in ASTM B193-16, "Standard Test Method for Resistivity of Electrical Conductor Materials," as summarized in part below:

$$R_t = R_T[1 + \alpha(t - T)]$$

Where
$R_T$=resistance at reference temperature T.
$R_t$=resistance as measured at temperature t.
T=reference temperature (in ° C.).
t=temperature at which measurement is made (in ° C.).
α=temperature coefficient of resistance of the specimen being measured at reference temperature T; 0.00393 per ASTM B193.

Figure 6:
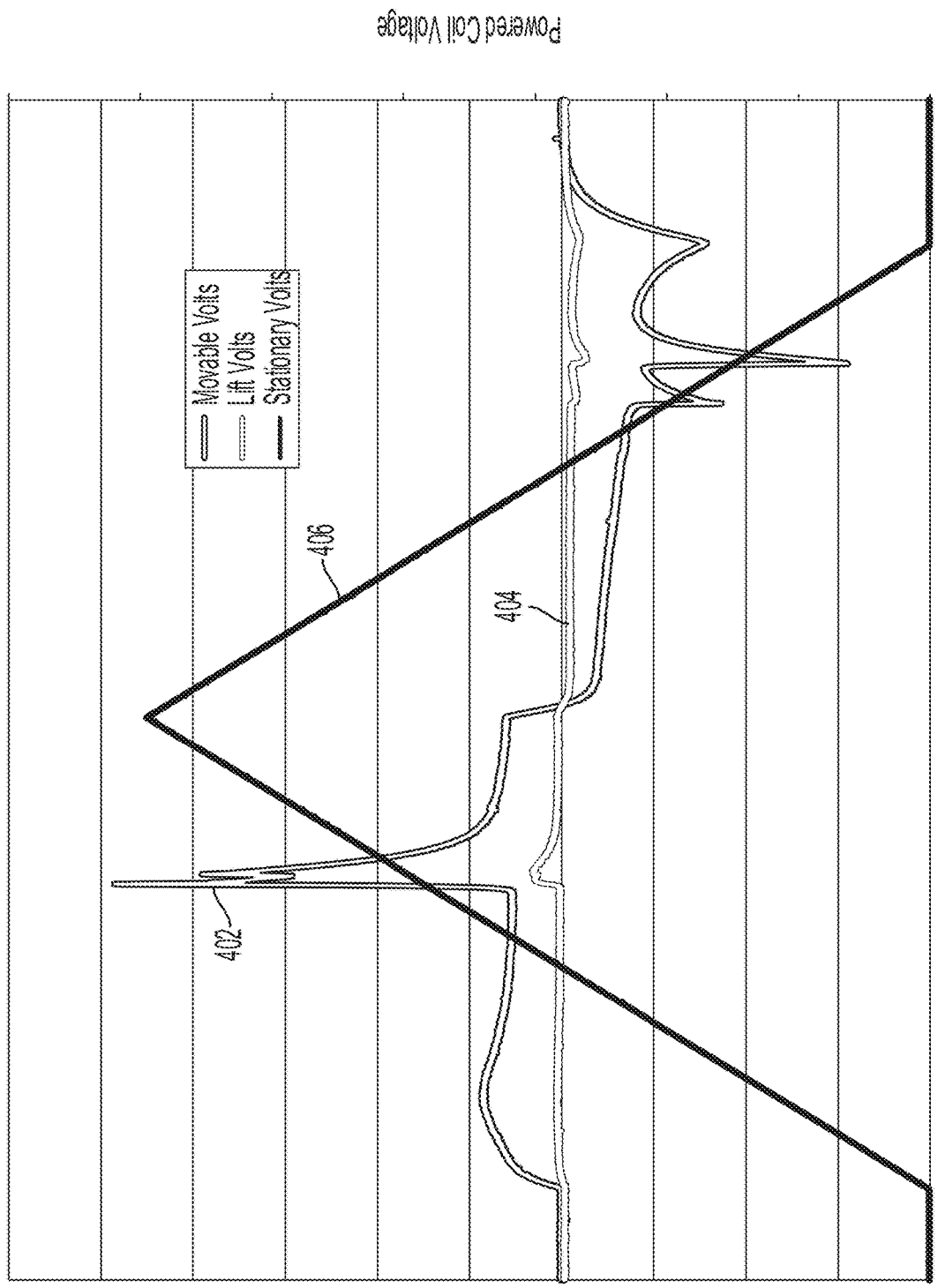
FIG. 6 is a graph of measurements of induced voltages within lift and movable gripper coils of a three-coil control rod drive mechanism while a stationary gripper coil is powered, according to at least one aspect of the present disclosure.

FIG. 6 is a graph 400 of measurements of induced voltages within lift and movable gripper coils of a three-coil control rod drive mechanism while a stationary gripper coil is powered, according to at least one aspect of the present disclosure. The graph 400 illustrates a movable gripper coil induced voltage trace 402, a lift gripper coil voltage trace 404, and a stationary gripper coil induced voltage trace 406. The left vertical axis is the induced voltage scale and the right vertical axis is the powered coil voltage. The horizontal axis represents time (Sec).

The induced voltage traces 402, 404, 406 within the lift and movable gripper coils of a three-coil control rod drive mechanism while the stationary gripper coil is powered show several aspects of the health and condition of the coil system. The polarity (+/−) of the induced voltages shows the polarity of the coil wires. If the polarity of the coil is wired backwards, the induced voltage trace 402, 4040, 406 will be a mirror image (about the horizontal [x] axis) of the induced voltage trace 402, 404, 406 shown. In one aspect, four coil and five coil control rod drive mechanisms are wired by design with alternating polarity. Three coil control rod drive mechanisms, however, are wired by design with like polarity. The relative amplitude of the induced voltage traces 402, 404, 406 also shows the relative position of the coils. The induced voltage traces 402, 404, 406 in FIG. 6 show that powering the stationary gripper coil (bottom coil) has more effect on the movable coil (middle coil) than the lift coil (top coil).

The amplitude of the induced voltage traces 402, 404, 406 also shows the relative inductance of the coil system. If one coil generates less induced voltage into the other two coils, and creates less induced voltage when powered by the other two coils, the coil would be expected to be degraded.

Figure 7:
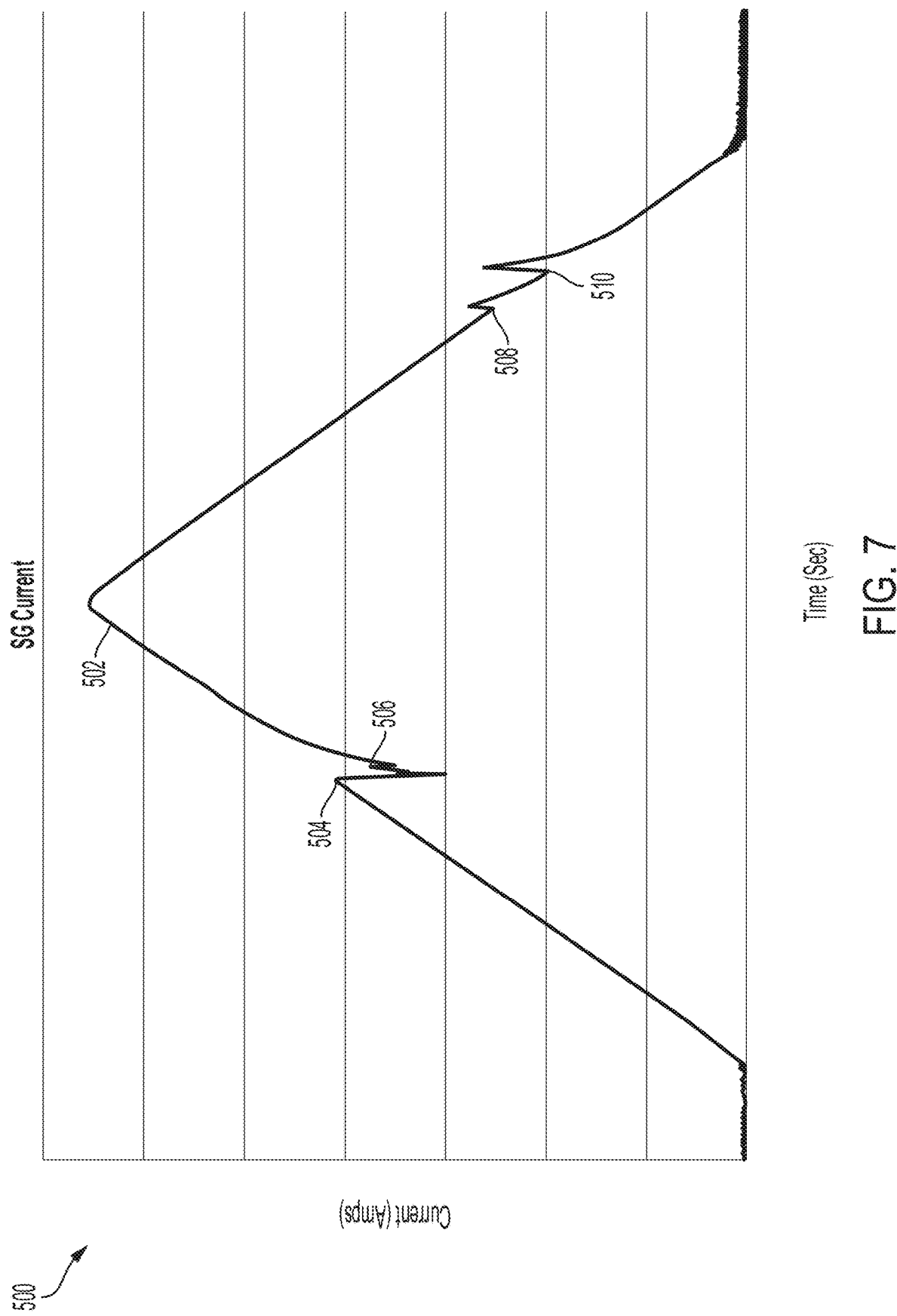
FIG. 7 is a graph of coil current measurements of the current flowing through a coil in which voltage is being applied to, according to at least one aspect of the present disclosure.

FIG. 7 is a graph 500 of coil current measurements of the current flowing through a coil in which voltage is being applied to, according to at least one aspect of the present disclosure. As shown in FIG. 7, the current trace 502 of current flowing through a stationary gripper coil which is powered by an applied voltage ramp over a fixed period of time. The vertical axis represents current (Amps) and the horizontal axis represents time (Sec).

The stationary coil current trace 502 has two engagement inflection points 504, 506 and two dropout inflection points 508, 510. The first engagement inflection point 504 is the engagement current through the coil when the stationary gripper is closed. The second engagement inflection point 506 is the engagement current through the coil when the stationary gripper load transfer is closed. The first dropout inflection point 508 is the dropout current through the coil when the stationary gripper load transfer is opening. The second dropout inflection point 510 is the dropout current through the coil when the stationary gripper is opening. The remainder of the coils will have only one engagement and one dropout point. The amplitude and time at which the inflections occur at are to calculated and recorded by the diagnostic system 100 described in FIG. 4. Engagement current is directly proportional to the force (and health) of the spring within the control rod drive mechanism.

Figure 8:
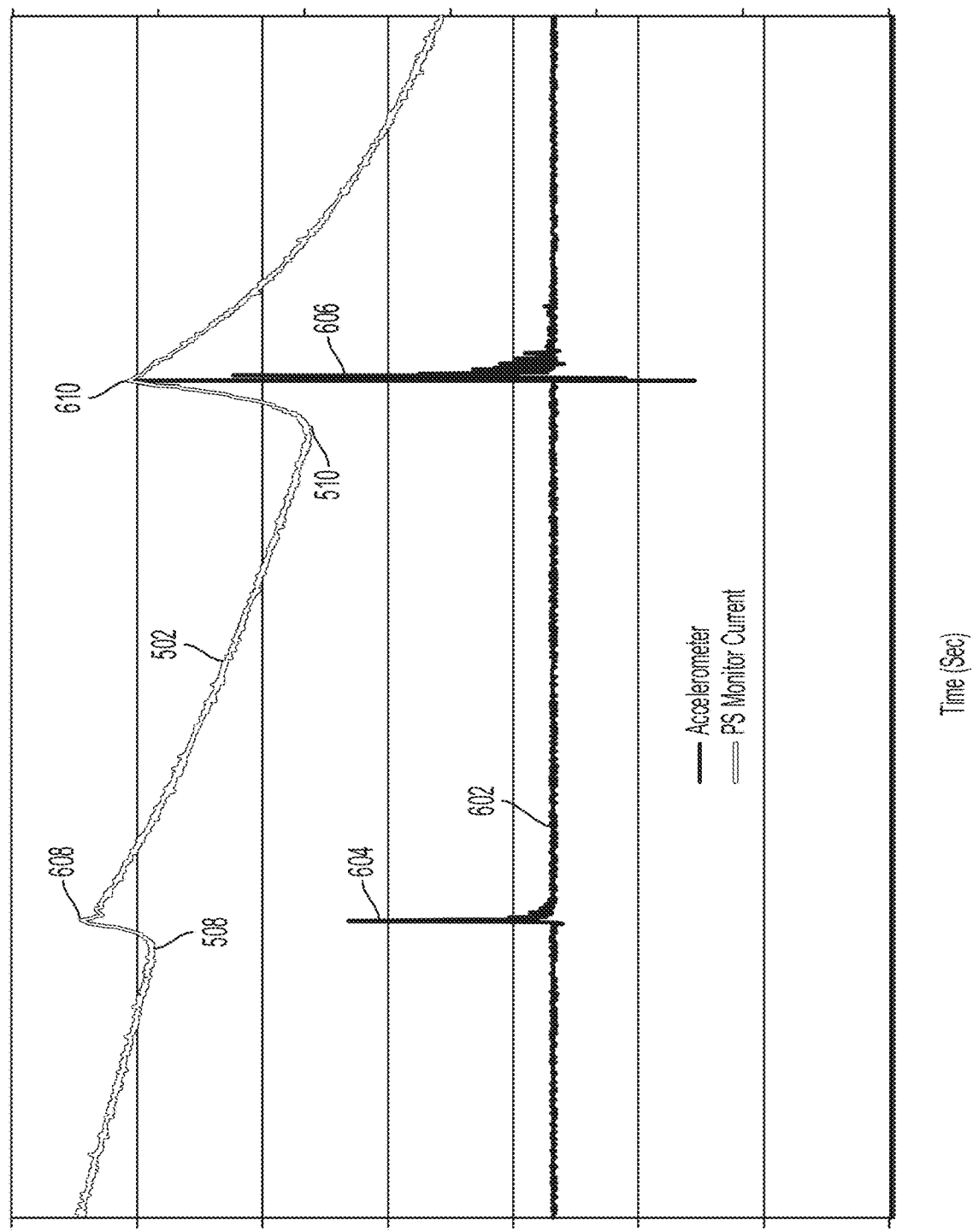
FIG. 8 shows a detail view of the stationary gripper coil dropout inflection points shown in FIG. 7, according to at least one aspect of the present disclosure.

FIG. 8 shows a detail 600 view of the stationary gripper coil dropout inflection points 508, 510 shown in FIG. 7, according to at least one aspect of the present disclosure. The left vertical is the scale for the accelerometer trace 602 and the right vertical axis is the scale for the stationary coil current trace 502. The horizontal axis represents time (Sec). FIG. 8 also shows an accelerometer trace 602, which is shown only for comparison purposes. As previously discussed, the diagnostic system 100 described in FIG. 4 does not include the ability to record accelerometer data because the diagnostic system 100 does not require accelerometers to determine certain characteristics of the control rod drive mechanism and to determine if degradation is present.

FIG. 8 shows the measurement of the time to complete the dropout. This time is directly proportional to the amount of friction with the latch assembly sub-components. The first dropout inflection point 508 indicates the start of the dropout motion. The stationary gripper load transfer end of motion is indicated by inflection point 608. The time between the dropout inflection point 508 and the end of motion inflection point 608 is the time to complete the motion. The accelerometer trace 604 marks the end of motion to confirm the results obtained with the diagnostic system 100 described in FIG. 4. The first dropout inflection point 508 indicates the start of the dropout motion. The stationary gripper load transfer end of motion is indicated by end of motion inflection point 608. The time between the dropout inflection point 508 and the end of motion inflection point 608 is the time to complete the motion. The accelerometer trace 604 marks the end of motion to confirm the results obtained with the diagnostic system 100 described in FIG. 4.

The second dropout inflection point 510 indicates the start of the dropout motion. The stationary gripper latch arms out gap fully open is indicated by the end of motion inflection point 610. The time between the second dropout inflection point 510 and the end of motion inflection point 610 is the time to complete the motion. The accelerometer trace 606 marks the end of motion to confirm the results obtained with the diagnostic system 100 described in FIG. 4.

Figure 9:
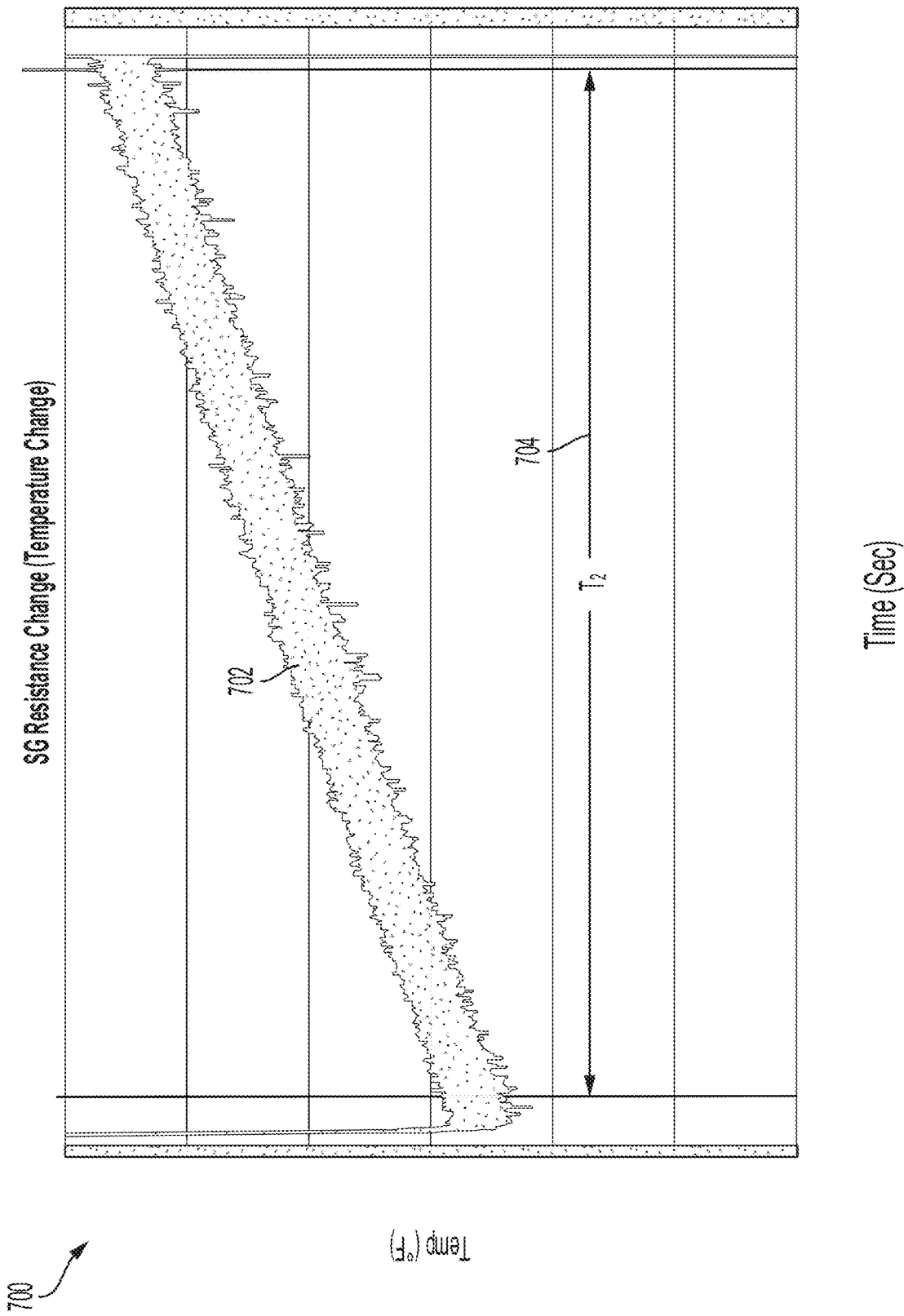
FIG. 9 is a graph illustrating temperature change of a powered stationary gripper coil, according to at least one aspect of the present disclosure.

FIG. 9 is a graph 700 illustrating temperature change of a powered stationary gripper coil, according to at least one aspect of the present disclosure. The vertical axis is the temperature scale (° F.) and the horizontal axis represents time (Sec). The graph 702 shows the temperature rise of a powered stationary gripper coil at an applied voltage of 100 Volts. After the completion of all of the coil current profiles for the coil stack 112 as shown in FIG. 4, the temperature rise test for each coil is performed using the diagnostic system 100 described in FIG. 4. Each coil is powered with a maximum program voltage for a predetermined time (e.g., one minute) while recording coil voltage and resistance. Coil resistance and temperature is be calculated, monitored, and recorded by the diagnostic system 100 throughout the test.

Calculations of coil resistance, engagement current, engagement time, time to complete engagement, and coil temperature tests can be performed continuously using the diagnostic system 100 as described herein. A calculation of coil inductance also may be performed. It may be possible to use the decay slope after coil dropout has completed, if the linear ramp of the supply voltage is subtracted from it. The decay slope can be used to determine the time constant for the coil, which can be used to calculate the inductance from the relationship of inductance divided by resistance equal to the time constant of a coil.

Figure 10:
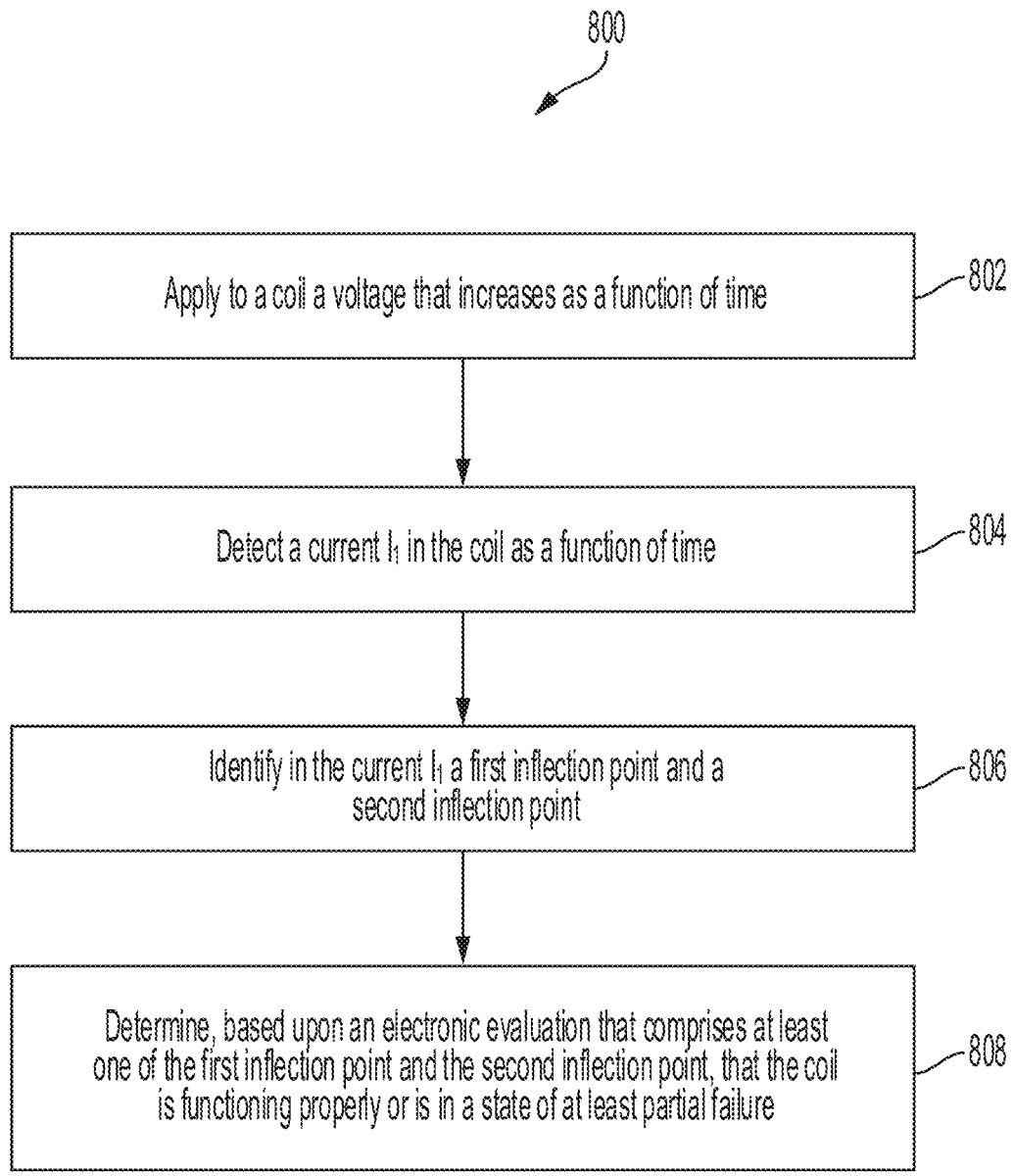
FIG. 10 is a logic flow diagram depicting a process of a control program or a logic configuration for diagnosing a drive mechanism of a control device of a nuclear reactor using a diagnostic apparatus structured to be electrically connected with a coil stack, the coil stack having a plurality of coils, according to at least one aspect of the present disclosure.

FIG. 10 is a logic flow diagram 800 depicting a process of a control program or a logic configuration for diagnosing a drive mechanism of a control device of a nuclear reactor using a diagnostic apparatus structured to be electrically connected with a coil stack, the coil stack having a plurality of coils, according to at least one aspect of the present disclosure. The logic flow diagram 800 will be described in connection with the diagnostic system 100 described in FIG. 4.

With reference now to FIGS. 4 and 10, the diagnostic system 100 is structured to be electrically connected with a coil stack 112 of a drive mechanism of a control device of a nuclear reactor. The coil stack 112 having a plurality of coils 102-110. The diagnostic system 100 includes a power supply 126 and a controller 152 comprising a processor 153 and a memory 155. The memory 155 includes stored therein a number of control algorithms or routines comprising a number of machine executable instructions. When the instructions are executed on the processor 153, the processor 153 sets the DPDT relays 136a, 136b in the configuration of the coil circuit Coil-5 in FIG. 4 and couples the contact of the SPDT relay 150 to the shunt resistor $R_6$ to cause the power supply 126 to apply 802 to the coil 110 of the plurality of coils 102-110 a voltage that varies as a function of time. The processor 153 then causes the shunt voltmeter 124 to detect 804 a current $I_1$ in the coil 110 as a function of time. The processor 153 reads the current $I_1$ and identifies 806 in the current $I_1$ a first inflection point and a second inflection point. The processor 153 determines 808, based upon an electronic evaluation that comprises at least one of the first inflection point and the second inflection point, that the coil 110 is functioning properly or is in a state of at least partial failure.

In another aspect, the processor 153 sets the DPDT relays 134a, 136b in the configuration of the coil circuit Coil-4 shown in FIG. 4 and conducts a test to detect in another coil 108 of the plurality of coils 102-110 an induced voltage as a function of time. The induced voltage is detected by the voltmeter 120 and recorded in the memory 155 by the processor 153.

In another aspect, the processor 153 determines based upon the electronic evaluation that the drive mechanism has a friction level that is either at an appropriate level or at an excessive level.

In another aspect, the processor 153 determines based upon the electronic evaluation that a spring of the drive mechanism is either functioning properly or in a state of at least partial failure.

In another aspect, the processor 153 records voltage and current and determines coil resistance during a diagnostic test procedure. In this configuration, the processor 153 sets the DPDT relays 132a, 132b in the configuration of the coil circuit Coil-3 shown in FIG. 4 and conducts a test to measure the resistance of the coil 106. The resistance of the coil 106 is measured by the voltmeter 118 and is recorded in the memory 155 by the processor 153.

In another aspect, the processor 153 records in the memory 155 a change in temperature within the coil 110, wherein the change in temperature indicates a condition of the coil 110 insulation system. By way of example, the graph 700 in FIG. 9 illustrates a temperature change of a powered coil.

In another aspect, the processor 153 records in the memory 155 induced voltage on an unpowered coil to assess coil health. In this configuration, the processor 153 sets the DPDT relays 134a, 134b in the configuration of the coil circuit Coil-4 shown in FIG. 4 and conducts a test to measure the induced voltage. The voltmeter 120 then measures the induced voltage and the processor 153 records the induced voltage in the memory 155.

In another aspect, the processor 153 records in the memory 155 the insulation resistance of the coil. In one configuration, the processor 153 sets the DPDT relays 128a, 128b in the configuration of the coil circuit Coil-1 shown in FIG. 4 and conducts a test to measure the coil-to-coil insulation resistance of the coil 102. The voltmeter 114 then measures the insulation resistance of the coil 102 and the processor 153 records the insulation resistance in the memory 155. In another configuration, the processor 153 sets the DPDT relays 130a, 130b in the configuration of the coil circuit Coil-2 shown in FIG. 4 and conducts a test to measure the coil-to-ground insulation resistance of the coil 104. The voltmeter 114 then measures the insulation resistance of the coil 104 and the processor 153 records the insulation resistance in the memory 155.

Figure 11:
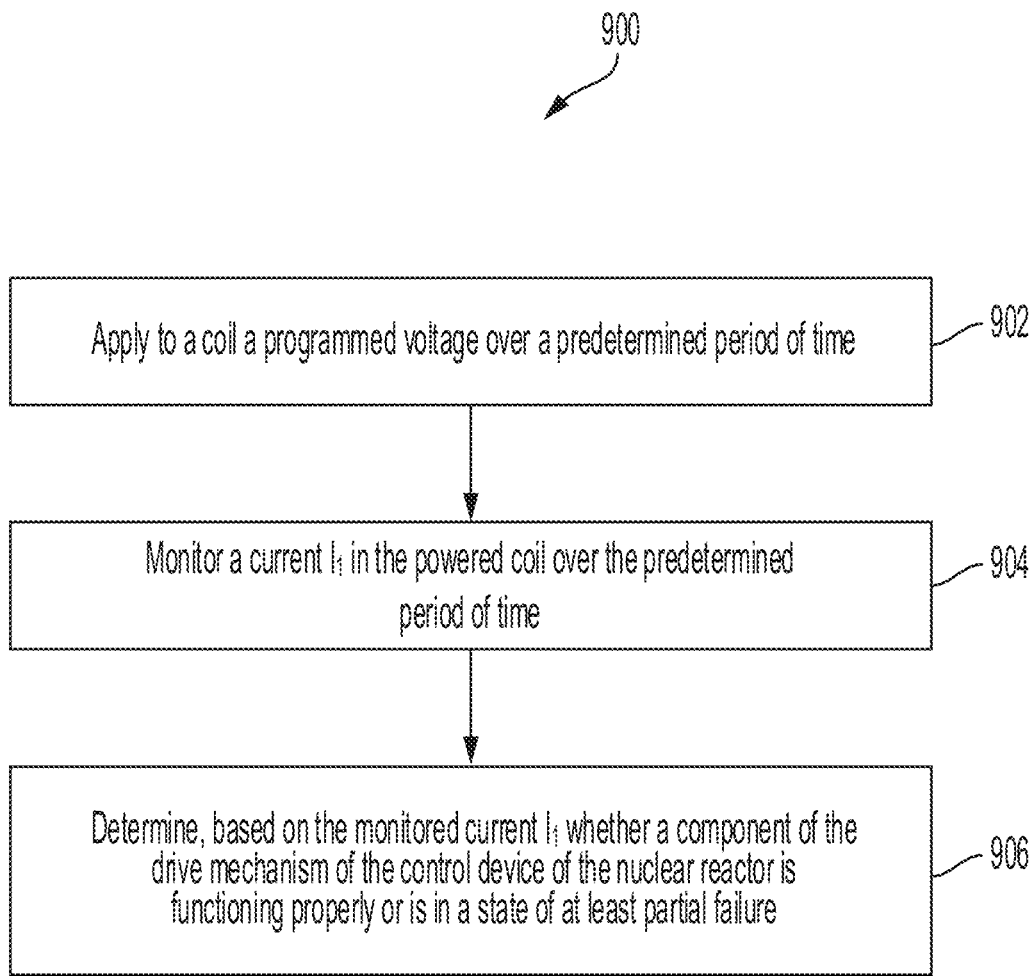
FIG. 11 is a logic flow diagram depicting a process of a control program or a logic configuration for diagnosing a drive mechanism of a control device of a nuclear reactor using a diagnostic apparatus structured to be electrically connected with a coil stack, the coil stack comprising at least three coils, according to at least one aspect of the present disclosure.

FIG. 11 is a logic flow diagram 900 depicting a process of a control program or a logic configuration for diagnosing a drive mechanism of a control device of a nuclear reactor using a diagnostic apparatus structured to be electrically connected with a coil stack, the coil stack comprising at least three coils, according to at least one aspect of the present disclosure. The logic flow diagram 900 will be described in connection with the diagnostic system 100 described in FIG. 4.

With reference now to FIGS. 4 and 11, the diagnostic system 100 is structured to be electrically connected with a coil stack 112 of a drive mechanism of a control device of a nuclear reactor. The coil stack 112 having at least three coils 106, 108, 110. The diagnostic system 100 includes a power supply 126 and a controller 152 comprising a processor 153 and a memory 155. The memory 155 includes stored therein a number of routines comprising a number of instructions. When executed on the processor 153, the processor 153 sets the DPDT relays 136a, 136b in the configuration of the coil circuit Coil-5 in FIG. 4 and couples the contact of the SPDT relay 150 to the shunt resistor R6 to cause the power supply 126 to apply 902 to the coil 110 a programmed voltage over a predetermined period of time. While the coil 110 is powered, the other coils 106, 108 are unpowered and the DPDT relays 132a, 132b, 134a, 134b are configured to measure voltage induced in the unpowered coils 106, 108 by the powered coil 110. The processor 153 then causes the shunt voltmeter 124 to monitor 904 a current $I_1$ in the powered coil 110 over the predetermined period. The processor 153 determines 906, based on the monitored current $I_1$, whether a component of the drive mechanism of the control device of the nuclear reactor is functioning properly or is in a state of at least partial failure.

In another aspect, the processor 153 identifies in the current $I_1$ a first inflection point and a second inflection point and determines an elapsed time period between the first inflection point and the second inflection point. The processor 153 compares the elapsed time period to a predetermined period time. When the elapsed time period is greater than the predetermined time period, the processor 153 determines the existence of a failing coil and/or excessive friction. When the elapsed time period is less than the predetermined time period, the processor 153 determines the existence of a broken or failed spring. The processor 153 also determines induced voltages on adjacent unpowered coils 106, 108. When the induced voltage on an unpowered coil 106, 108 is an expected value, the processor 153 determines the existence of excessive friction. When the induced voltage on an unpowered coil 106, 108 is below the expected value, the processor 153 determines that the powered coil 110 is a failing coil.

As used herein a processor or processing unit is an electronic circuit which performs operations on some external data source, usually memory or some other data stream. The term is used herein to refer to the central processor (central processing unit) in a system or computer systems (especially systems on a chip (SoCs)) that combine a number of specialized "processors."

As used herein, a system on a chip or system on chip (SoC or SOC) is an integrated circuit (also known as an "IC" or "chip") that integrates all components of a computer or other electronic systems. It may contain digital, analog, mixed-signal, and often radio-frequency functions—all on a single substrate. A SoC integrates a microcontroller (or microprocessor) with advanced peripherals like graphics processing unit (GPU), Wi-Fi module, or coprocessor. A SoC may or may not contain built-in memory.

As used herein, a microcontroller or controller is a system that integrates a microprocessor with peripheral circuits and memory. A microcontroller (or MCU for microcontroller unit) may be implemented as a small computer on a single integrated circuit. It may be similar to a SoC; an SoC may include a microcontroller as one of its components. A microcontroller may contain one or more core processing units (CPUs) along with memory and programmable input/output peripherals. Program memory in the form of Ferro-electric RAM, NOR flash or OTP ROM is also often included on chip, as well as a small amount of RAM. Microcontrollers may be employed for embedded applications, in contrast to the microprocessors used in personal computers or other general purpose applications consisting of various discrete chips.

As used herein, the term controller or microcontroller may be a stand-alone IC or chip device that interfaces with a peripheral device. This may be a link between two parts of a computer or a controller on an external device that manages the operation of (and connection with) that device.

As used herein, the terms "component," "system," "module" and the like can refer to a computer-related entity, either hardware, a combination of hardware and software, software, or software in execution, in addition to electro-mechanical devices. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers. The word "exemplary" is used herein to mean serving as an example, instance, or illustration. Any aspect or design described herein as "exemplar" is not necessarily to be construed as preferred or advantageous over other aspects or designs.

As used herein, the term control circuit may be any stand alone or combination electronic circuit such as, for example, a processing unit, processor, microcontroller, microcontroller unit, controller, digital signal processor (DSP), programmable gate array (PGA), field PGA (FPGA), programmable logic device (PLD), system on chip (SoC), application specific integrated circuit (ASIC), graphics processing unit (GPU), and the like. According to various aspects, process flow diagrams described herein may be implemented by a digital device such as a control circuit.

Although the various aspects of the present disclosure describe instruction handling and distribution in the context of execution units and logic circuits, other aspects of the present disclosure can be accomplished by way of data and/or instructions stored on a machine-readable, tangible medium, which when performed by a machine cause the machine to perform functions consistent with at least one aspect. In one aspect, associated functions of the present disclosure are embodied in machine-executable instructions. The instructions can be used to cause a general-purpose or special-purpose processor that is programmed with the instructions to perform the steps of the functions described in the present disclosure. Aspects of the present disclosure may be provided as a computer program product or software which may include a machine or non-transitory computer-readable medium having stored thereon instructions which may be used to program a computer (or other electronic devices) to perform one or more operations according to aspects of the present disclosure. Alternatively, functions according to the present disclosure might be performed by specific hardware components that contain fixed-function logic for performing the functions, or by any combination of programmed computer components and fixed-function hardware components.

Instructions used to program logic to perform various disclosed aspects can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the non-transitory computer-readable medium includes any type of tangible machine-readable medium suitable for storing or transmitting electronic instructions or information in a form readable by a machine (e.g., a computer).

Various examples have been described with reference to certain disclosed aspects. The various aspects are presented for purposes of illustration and not limitation. One skilled in the art will appreciate that various changes, adaptations, and modifications can be made without departing from the scope of the disclosure or the scope of the appended claims.

What is claimed is:

1. A diagnostic apparatus structured to be electrically connected with a coil stack of a drive mechanism of a control device of a nuclear reactor, the coil stack having a plurality of coils, the diagnostic apparatus comprising:
a power supply; and
a controller comprising a processor and a memory, the memory having stored therein instructions which, when executed on the processor, cause the diagnostic apparatus to:
apply to a coil of the plurality of coils a voltage that varies as a function of time;
detect a current in the coil as a function of time;
identify in the current a first inflection point and a second inflection point, wherein the first inflection point corresponds to a change from increasing current to decreasing current or a change from decreasing current to increasing current, and wherein the second inflection point corresponds to a change from increasing current to decreasing current or a change from decreasing current to increasing current; and
determine, based upon an electronic evaluation that comprises the first inflection point and the second inflection point, that the coil is one of:
functioning properly; and
in a state of at least partial failure.

2. The diagnostic apparatus of claim 1, wherein the instructions which, when executed on the processor, cause the diagnostic apparatus to:
detect in another coil of the plurality of coils an induced voltage as a function of time; and
determine, based upon an electronic evaluation that comprises the induced voltage, that the coil is one of:
functioning properly; and
in a state of at least partial failure.

3. The diagnostic apparatus of claim 1, wherein the instructions which, when executed on the processor, cause the diagnostic apparatus to:
determine based upon the electronic evaluation that the drive mechanism has a friction level that is one of:
at an appropriate level; and
at an excessive level.

4. The diagnostic apparatus of claim 1, wherein the instructions which, when executed on the processor, cause the diagnostic apparatus to:
determine based upon the electronic evaluation that a spring of the drive mechanism is one of:
functioning properly; and
in a state of at least partial failure.

5. The diagnostic apparatus of claim 1, wherein the instructions which, when executed on the processor, cause the diagnostic apparatus to:
record voltage and current; and
determine coil resistance during a diagnostic test procedure.

6. The diagnostic apparatus of claim 1, wherein the instructions which, when executed on the processor, cause the diagnostic apparatus to record a change in temperature within the coil, wherein the change in temperature indicates a condition of a coil insulation system for the coil stack.

7. The diagnostic apparatus of claim 1, wherein the instructions which, when executed on the processor, cause the diagnostic apparatus to record induced voltage on an unpowered coil to assess coil health.

8. The diagnostic apparatus of claim 1, wherein the instructions which, when executed on the processor, cause the diagnostic apparatus to record insulation resistance of the coil.

9. A diagnostic method for diagnosing a drive mechanism of a control device of a nuclear reactor using a diagnostic apparatus structured to be electrically connected with a coil stack, the coil stack having a plurality of coils, the diagnostic method comprising:
applying to a coil of the plurality of coils a voltage that varies as a function of time;
detecting a current in the coil as a function of time;
identifying in the current a first inflection point and a second inflection point, wherein the first inflection point corresponds to a change from increasing current to decreasing current or a change from decreasing current to increasing current, and wherein the second inflection point corresponds to a change from increasing current to decreasing current or a change from decreasing current to increasing current; and
determining, based upon an electronic evaluation that comprises at least one of the first inflection point and the second inflection point, that the coil is one of:
functioning properly; and
in a state of at least partial failure.

10. The diagnostic method of claim 9, further comprising:
detecting in another coil of the plurality of coils an induced voltage as a function of time; and
determining, based upon an electronic evaluation that comprises the induced voltage, that the coil is one of:
functioning properly; and
in a state of at least partial failure.

11. The diagnostic method of claim 9, further comprising determining based upon the electronic evaluation that the drive mechanism has a friction level that is one of:
at an appropriate level; and
at an excessive level.

12. The diagnostic method of claim 9, further comprising determining based upon the electronic evaluation that a spring of the drive mechanism is one of:
functioning properly; and
in a state of at least partial failure.

13. The diagnostic method of claim 9, further comprising:
recording voltage and current; and
determining coil resistance during a diagnostic test procedure.

14. The diagnostic method of claim 9, further comprising recording a change in temperature within the coil, wherein the change in temperature indicates a condition of a coil insulation system for the coil stack.

15. The diagnostic method of claim 9, further comprising recording induced voltage on an unpowered coil to assess coil health.

16. The diagnostic method of claim 9, further comprising recording insulation resistance of the coil.

17. A diagnostic method for diagnosing a drive mechanism of a control device of a nuclear reactor using a diagnostic apparatus structured to be electrically connected with a coil stack, the coil stack comprising at least three coils, the diagnostic method comprising:
applying a programmed voltage to each of the at least three coils over a predetermined period, one at a time, wherein while one of the at least three coils is powered, the other coils are unpowered;

monitoring a current within each of the at least three coils over the predetermined period; and determining, based on the monitored current, whether a component of the drive mechanism of the control device of the nuclear reactor is one of:
functioning properly; and
in a state of at least partial failure.

18. The diagnostic method of claim 17, further comprising identifying in the current a first inflection point and a second inflection point, wherein the first inflection point corresponds to a change from increasing current to decreasing current or a change from decreasing current to increasing current, and wherein the second inflection point corresponds to a change from increasing current to decreasing current or a change from decreasing current to increasing current.

19. The diagnostic method of claim 18, further comprising determining an elapsed time period between the first inflection point and the second inflection point.

20. The diagnostic method of claim 19, further comprising:

comparing the elapsed time period to a predetermined period time;

wherein when the elapsed time period is greater than the predetermined time period, determining the existence of a failing coil or excessive friction; and wherein when the elapsed time period is less than the predetermined time period, determining the existence of a broken or failed spring.

21. The diagnostic method of claim 17, further comprising:

determining induced voltages on adjacent unpowered coils;

wherein when the induced voltage is an expected value, determining the existence of excessive friction; and wherein when the induced voltage is below the expected value, determining that the powered coil is a failing coil.

\* \* \* \* \*